United States Patent [19]

Keller

[11] 4,045,278

[45] Aug. 30, 1977

[54] METHOD AND APPARATUS FOR FLOATING MELT ZONE OF SEMICONDUCTOR CRYSTAL RODS

[75] Inventor: Wolfgang Keller, Munich, Germany

[73] Assignee: Siemens Aktiengesellschaft, Berlin & Munich, Germany

[21] Appl. No.: 702,575

[22] Filed: July 6, 1976

Related U.S. Application Data

[60] Continuation-in-part of Ser. No. 637,986, Dec. 5, 1975, Pat. No. 3,989,468, Ser. No. 638,261, Dec. 8, 1975, Pat. No. 3,996,096, and Ser. No. 638,302, Dec. 8, 1975, Pat. No. 3,996,011, each is a division of Ser. No. 580,548, May 27, 1975, Pat. No. 3,961,906, and Ser. No. 580,585, May 27, 1975, Pat. No. 3,988,197, each is a division of Ser. No. 525,641, Nov. 20, 1974, Pat. No. 3,923,468.

[30] Foreign Application Priority Data

July 11, 1975 Germany ............................. 2531099
Nov. 22, 1973 Germany ............................. 2358300

[51] Int. Cl.² ............................................. B01J 17/10
[52] U.S. Cl. ................................... 156/602; 156/620; 23/273 SP
[58] Field of Search ............................ 156/602, 620; 23/273 SP, 273 Z

[56] References Cited

U.S. PATENT DOCUMENTS

| | | | |
|---|---|---|---|
| 3,346,344 | 10/1967 | Levinstein et al. | 156/602 |
| 3,389,987 | 6/1968 | Lebek et al. | 156/602 |
| 3,923,468 | 12/1975 | Keller | 23/273 SP |
| 3,935,058 | 1/1976 | Kuhlmann-Schafer | 156/602 |

FOREIGN PATENT DOCUMENTS 2,358,300   6/1975   Germany

OTHER PUBLICATIONS

Lichtensteiger et al., "Modulation of Dopant Segregation by Electric Currents in Cnakralski-Type Crystal Growth", J. Electrochem. Soc., June 1971, pp. 1013-1014.

Primary Examiner—Norman Yudkoff
Assistant Examiner—Barry I. Hollander
Attorney, Agent, or Firm—Hill, Gross, Simpson, Van Santen, Steadman, Chiara & Simpson

[57] ABSTRACT

Stock semiconductor crystal rods are zone melt refined by positioning such stock rods in a zone melt environment with a seed crystal attached to a lower end thereof, generating a melt zone at the juncture of the seed crystal and stock rod and controllably moving the melt zone away from the juncture and through the stock rod to a select point thereon, uniformly supporting the cone-shaped lower portion of the rod being refined from below the juncture to an area adjacent the select point so as to prevent vibrations and the like within the rod being processed, applying a controlled electrical current across the melt zone from the ends of the rod being refined and controllably moving the melt zone from the select point through the remainder of the rod. The uniform support is provided by a movable electrically conductive funnel-shaped jacket filled with an electrically conductive stabilizing means, such as metal spheroids or particulate silicon particles, molten metal, etc. and the electrical leads are connected to such jacket and to an upper rod support member whereby electrical current is fed from one end of the rod to the other.

7 Claims, 1 Drawing Figure

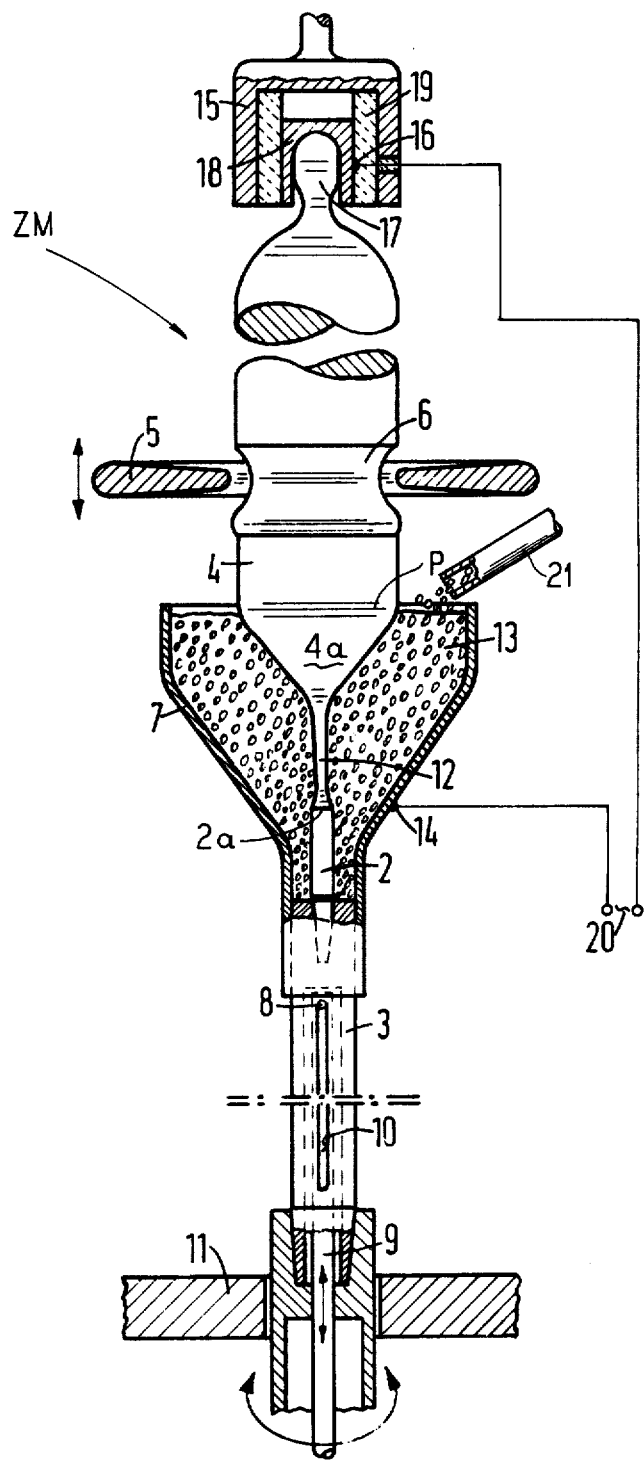

METHOD AND APPARATUS FOR FLOATING MELT ZONE OF SEMICONDUCTOR CRYSTAL RODS

CROSS-REFERENCE TO RELATED APPLICATIONS

This is a continuation-in-part of my earlier filed U.S. Ser. No. 637,986, filed Dec. 5, 1975, now U.S. Pat. No. 3,989,468; U.S. Ser. No. 638,261, filed Dec. 8, 1975, now U.S. Pat. No. 3,996,096; and U.S. Ser. No. 638,302, filed Dec. 8, 1975, now U.S. Pat. No. 3,996,011; all of which are divisionals of my U.S. Ser. No. 580,548, filed May 27, 1975, now U.S. Pat. No. 3,961,906 and U.S. Ser. No. 580,585, filed May 27, 1975, now U.S. Pat. No. 3,988,197; both of which are, in turn, divisionals of my U.S. Ser. No. 525,641, filed Nov. 20, 1974, now U.S. Pat. No. 3,923,468; all of which are incorporated herein by reference.

BACKGROUND OF THE INVENTION

1. Field of the Invention

The invention relates to processing semiconductor crystal rods and somewhat more particularly to a method and apparatus for floating zone melt refining of a semiconductor crystal whereby dislocations and the like within the processed crystal are avoided.

2. Prior Art

Semiconductor crystals, particularly those composed of silicon, are generally produced by a floating zone melt refining process whereby a monocrystalline seed having a relatively small diameter is melt-connected, as with the aid of an induction heating coil, to an end of a relatively large diameter polycrystalline semiconductor rod and a melt zone is generated at the juncture of the seed crystal and the polycrystalline rod and passed one or more times along the length of the polycrystalline rod so as to convert the same to a monocrystalline state. The melt zone is moved by providing relative movement between the polycrystalline rod and a heat source, such as an induction heating coil, which may be the same one used to melt-connect the seed crystal with the rod or be different therefrom. In this manner, a polycrystalline rod is purified and converted into a monocrystalline member.

In the production of semiconductor components from so-produced semiconductor rods, it is desirable that the semiconductor rods be as free as possible from dislocations and other crystal lattice irregularities which interfere with electrical properties of the semiconductor components produced therefrom. Further, the presence of dislocations, etc. within the semiconductor material decreases the life of minority carriers within such semiconductor components.

German Auslegeschrift No. 1,079,583 (which generally corresponds to British Letters Pat. No. 889,160) suggests that dislocations in rod-shaped semiconductor crystals may be decreased at the melt-connected juncture of the seed crystal and such semiconductor rod by decreasing the cross-section of the semiconductor rod at the direct proximity of such melt-connecting juncture prior to the last pass of the melt zone through the semiconductor member. Dislocations which may be present in the seed crystal are thus given a chance to heal in the thus-produced thin connecting piece or bottleneck-shaped bridge between the seed crystal and the semiconductor member.

German Letters Pat. No. 1,128,413 (which generally corresponds to U.S. Pat. No. 3,175,891) discloses that substantially dislocation-free rod-shaped silicon monocrystals may be produced, for example, by controlling the rate or speed of travel of one or more passages of a floating zone melt through the rod. This reference suggests that all passage of the melt zone start in the seed crystal and that the travel speed of the melt zone in a seed crystal be controlled so as to be in the range of about 7 to 15 mm/min. During the last pass of the melt zone, the silicon rod cross-section at the junction of the seed crystal and a silicon rod is constricted by a temporary relative movement of the rod and at a speed greater than 25 mm/min., while the speed of the melt zone is steadily decreased from this constriction point until the full cross-section of the rod is again attained. Thereafter, the melt zone is moved through the rod at speeds less than about 7 mm/min.

It has been noted that when semiconductor rods of a fairly large diameter are being produced by the floating zone melt process, the rod-shaped monocrystals which grow at the seed crystal during the last passage of the melt zone tend to vibrate or oscillate, particularly at the thin-connecting or bottleneck-shaped bridging piece between the monocrystal and the seed crystal. This drawback is particularly acute when thick monocrystal rods are being produced. These vibrations appear to cause a development of dislocations and other irregularities in the monocrystal as the molten material becomes rigid during the last passage of the melt zone through the semiconductor rod. In addition, such oscillations often cause a dripping of molten material from the melt zone or even a breakage of the bottleneck-shaped bridging piece between the seed crystal and the semiconductor rod, which, of course, causes an interruption in the zone melt process.

I have disclosed in German Offenlegungsschrift No. 1,519,901 a means of supporting the ends of a crystal rod at the juncture thereof with a seed crystal which comprise a finger-like support means that is positioned on the upper edge of a casing and which is axially movable and encloses the mounting for the seed crystal. However, this arrangement does not completely obviate vibrations or oscillations during the growth of very thick (i.e., having a diameter larger than about 30 mm) dislocation-free semiconductor monocrystalline rods since the finger-like supports do not uniformly touch the overall round cone portion of such rod. Due to this instability, increased oscillations may be produced which oppose the supporting effect desired or may even eliminate any beneficial supporting action.

I have also disclosed in my above referenced earlier disclosures, a movable hollow funnel-shaped casing coupled to a lower rod mounting member and which is movable from a lower position to an upper position for encompassing a cone area of the rod being processed. The interior of the funnel-shaped casing is provided with an oscillation or vibration dampening means, such as particulate silicon, quartz, sand, metal, metal spheroids, a liquefied metal which solidifies after contact with the cone area of the rod or metal inserts which form a eutectic mixture with the molten material of the rod on contact and then solidified to provide support for the rod being processed. The use of funnel-shaped casing in this manner prevents vibrations and the like which typically occur when a melt zone on a semi-conductor rod being refined moves too far away (depending on the diameter being processed, about 50 cm) from the juncture of the seed crystal and the stock rod or, respectively, from the bottleneck-shaped bridging area between the seed crystal and the processed rod. It is hypothesized that the rod weight on the bottleneck area becomes too great and the funnel-shaped casing filled with the vibration dampening means relieves the rod weight and prevents dislocations and the like from occuring in the rod being processed.

In the system described in my earlier referenced disclosures, the supporting jacket is axially movable relative to the rod support by means acting thereon outside the zone melt chamber. In these systems, as the melt zone approaches a given distance from the juncture of the seed crystal and the stock rod (which distance is critical for the occurrence of vibrations and/or oscillations in the crystal lattice), the empty funnel-shaped jacket is moved upward so as to encompass the cone-like region of the processed rod situated above the seed crystal. Then, the stabilizing means is brought into contact with cone region of the rod, as by filling the jacket with particulate silicon or the like. However, the jacket may also be constructed so as to function as a lifting means whereby the granular or spherical oscillation dampening material is in the jacket prior to the upward movement thereof.

SUMMARY OF THE INVENTION

The invention provides an improved zone melt process and apparatus therefor which not only substantially eliminates the development of oscillations or the like at the juncture of a seed crystal and a semiconductor rod during the passage of a melt zone through the semi-conductor rod but which also allows the passage of a controlled electrical current through such rod by including a wide-area current supply means at the lower end of such rod and another current supply means at the upper end of such rod. The electrical current may be controlled to alter the thermal balance in the region of the melt zone by the Peltier effect and thereby influence the form of the growth interface at the melt zone-solid rod boundary. In addition, the electrical current may be fed in controlled pulses to introduce coincident growth marks in the processed rod, which allow one to monitor the growth operation.

BRIEF DESCRIPTION OF THE DRAWING

The drawing is a partial cross-sectional elevated view of a semiconductor rod within a zone melt environment, schematically illustrating an embodiment of the invention.

DESCRIPTION OF THE PREFERRED EMBODIMENTS

The invention provides an improved method and apparatus for producing dislocation-free monocrystalline semiconductor rods.

In accordance with the principles of the method embodiments of the invention, a polycrystalline semiconductor rod, such as principally composed of silicon, is melt-connected to a seed crystal and positioned within a floating zone melt environment. A melt zone is generated at the juncture between the stock polycrystalline rod and the seed crystal and controllably moved from such juncture through the stock rod to a select point thereon and then provided with a uniform support along the lower cone-shaped area of the rod below such point so as to prevent oscillations or the like from occuring within the rod. A controlled electrical current may then be passed through the seed crystal-stock rod structure while the melt zone is again controllably moved through the remainder of the stock rod. In this manner, oscillations and the like at the juncture between the stock rod and the seed crystal are avoided so that dislocations and other crystal lattice irregularities cannot develop within the processed rod while the growth boundary between the melt zone and the stock rod is beneficially influenced by the passage of an electrical current therethrough.

In accordance with the principles of the apparatus embodiment for the invention, an electrically conductive funnel-shaped jacket is coupled with a seed crystal mounting means so as to be axially and rotatably movable with such mounting means and axially movable relative to the mounting means. At an upper most position, the jacket uniformly encloses the conical area of the rod being processed and electrically conductive stabilizing means, such as metal spheroids, particulate quartz, sand, silicon, molten metal, etc. within the funnel-shaped jacket contact the encompassed rod area and provide support thereto. An electrical contact which is in communication with a voltage source is provided on the jacket so that the filled jacket functions as a wide-area current supply means at the lower end of the rod. An electrically conductive socket is provided at the upper end of the stock rod and coupled to another electrical contact so that controlled electrical current can be fed longitudinally through the rod and influence the growth boundary between the melt zone and the stock rod.

In certain embodiments of the invention electrical current is continuously fed through the rod being processed via the wide-area current supply means earlier described. In such embodiments, the thermal balance in the region of the melt zone is altered by the arising Peltier effect so that the form of the growth boundary is influenced.

In other embodiments of the invention, electrical current is controllably intermittently (as in pulse form) fed to the melt zone of a growing rod via the wide-area current supply means (i.e., the electrically conductive jacket and stabilizing means earlier described) so as to introduce coincident growth marks on the processed rod and thereby monitor the growth operation. In proceeding with the principles of the invention and utilizing the conductive funnel-shaped jacket as the lower contact for a large area current supply, much higher current densities may be provided in the crystal rod than is possible with current supplied through the thin bottleneck-shaped bridging piece above the seed crystal. The introduction of such growth marks by brief high (axial) current pulses of a known or controlled frequency generates important data about the crystal growth parameters (i.e., momentary growth rate at each point, dopant distribution in simultaneously grown crystal areas, etc.). Additional aspects of this feature are described by M. Lichtensteiger et al in the "Journal of Electrochemical Society", Vol. 118, No. 6, June 1971, pages 1013–1015.

In the drawings, only essential features of a floating zone melt apparatus constructed in accordance with the principles of the invention have been illustrated in order to simplify the understanding of the invention and workers in the art will readily recognize and supply other elements and/or features required to obtain an operable floating zone melt apparatus and such operable apparatus will hereinafter and in the claims be referred to as a floating zone melt apparatus and/or a floating zone melt environment.

As shown in the drawing, a monocrystalline seed 2 is mounted within a support member 3 which is located within a floating zone melt apparatus and/or environment ZM. The seed crystal 2 may be formed into a bottleneck-shaped for eliminating any dislocations and is melt-connected to a lower end of a stock semiconductor crystal rod 4 so as to form a juncture 2a therebetween. The rod 4 and the seed crystal 2, may, for example, be composed of silicon or other semi-conductor material. A melt zone 6 is generated, as with the aid of an induction heating coil 5 and controllably moved in an axial direction through the rod 4 from the juncture 2a upwards to a select point P on the rod 4. Movement of the melt zone 6 is achieved via relative axial movement between the rod 4 and thr coil 5.

An electrically conductive funnel-shaped jacket 7, for example, composed of titanium, steel or some similar electrically conductive material, is mounted so as to encase the seed support member 3. A drive means (schematically illustrated as the vertical double-headed arrow and the horizontally curved double-headed arrow) for the mounting member 3 is located outside the bottom wall 11 of the floating zone melt apparatus ZM so that the jacket 7 is axially and rotatably movable with the mounting member 3. In addition, the jacket 7 is independently axially movable relative to the mounting member 3. Thus, when the mounting member 3 is axially or rotatably moved, the jacket 7 is likewise moved, but the jacket 7 may be axially movable independent of the mounting member 3. The jacket 7 is supported on a stud 8 which is attached to a pin 9 arranged within the mounting member 3 and which is axially movable. The stud 8 may be positioned within a guide slot 10 within the mounting member 3. Workers in the art will readily appreciate that other coupling means may also be utilized in accordance with the principles of the invention.

As indicated earlier, reference numeral 11 indicates a portion of a bottom wall of an enclosed chamber typically utilized in a floating zone melt apparatus and various seal means, drive means, atmosphere control means, energy supply means, etc. have been omitted from the drawings in order to simplify the understanding of the invention and to provide a better overall view of the essential features of the invention.

The drawing shows the relative position of the elements after the lower rod end 4a has been provided with a uniform support. The rod end 4a at this stage of the process has grown as a monocrystal without dislocations above the relatively thin connecting or bridging piece 12. During this growth process, both the rod 4 and the seed crystal 2 may be rotated about their respective axes so that there is a danger that the end 4a of the rod 4 may begin to oscillate or vibrate when the melt zone 6 moves sufficiently away from the juncture 2a.

Before the melt zone 6 reaches the critical (i.e. for the development of oscillations) the distance from the bottleneck-shaped area 12, the funnel-shaped jacket 7 is moved, as with the aid of pin 9, upwardly so as to encompass the cone region of the semiconductor rod 4 situated above the seed crystal 2. In order to insure a positive support and provide a stabilizing means, a self-adjusting electrically conductive dampening or stabilizing means 13 is provided between the interior of the funnel-shaped jacket 7 and the periphery of the lower end 4a of the rod. A conductive stabilizing means 13 may, for example, be comprised of steel or metal spheroids. Alternatively, the stabilizing means may be comprised of steel granules, silicon granules, or molten lead or indium, which solidifies in the jacket 7 or any other conductive stabilizing means, for example, or disclosed in my earlier referenced parent disclosures, and provides the desired support. In accordance with the principles of the invention whatever form of stabilizing means is selected, it must be electrically conductive. As is apparent from the drawing, once the jacket 7 has been moved to its operative or supporting position, the rod 4 can no longer oscillate on the bottleneck-shaped area 12. The lower rod portion 4a above the seed crystal and the narrow constricting or bridging piece 12 is already sufficiently cold and rigid at this time so that no dislocations or the like can form.

In one embodiment of the invention, the jacket 7 includes means 21 associated or attached laterally thereto for introducing the stabilization means 13 thereinto after the jacket has been moved to the support position.

In order to provide passage for electrical current through the growth interface in a continuous or a discontinuous manner, the jacket 7 is provided with an electrical contact means 14, which, in turn, is operationally connected to a voltage source 20. To complete the circuit, an upper contact means 16 is attached to a conductive socket 18, for example, composed of tantalum, molybdenum, stainless steel, titanium or some other conductive material, which is mounted in an insulating manner within an upper rod support member 15. The socket 18 may be force-fitted directly over an upper end 17 of the stock rod 4 or some other securement means may be utilized. The conductive socket 18 may be insulated from the support member 15 by a dielectric ring 19, for example, composed of aluminum oxide. The upper contact means 16 is also operationally connected to a voltage source 20, which may be controlled for continuous or discontinuous operations as desired.

With the foregoing general discussion in mind, there is presented detailed examples which will illustrate to those skilled in the art the manner in which the invention is carried out. However, the examples are not to be construed as limiting the scope of the invention in any way.

EXAMPLE 1

A floating melt zone apparatus essentially identical to that illustrated in the drawings was set up and a silicon rod and seed crystal were mounted therein as shown. Current pulses of 20 A/cm$^2$ at frequencies ranging from 10 to 0.1 Hz were fed across the melt zone during the floating melt zone refining of the rod. After completion, it was noted that coincident growth marks were produced on the silicon monocrystalline rod enabling one to determine the various growth parameters.

EXAMPLE 2

In a similar setup to that described in Example 1, an alternating current of 50 to 200 A/cm$^2$ was fed across the growth interface. This produced an additional heating along the rod and aided the refining process.

As is apparent from the foregoing specification, the present invention is susceptible of being embodied with various alterations and modifications which may differ particularly fron those that have been described in the preceding specification and description. For this reason, it is to be fully understood that all of the foregoing is intended to be merely illustrative and is not to be construed or interpreted as being restrictive or otherwise limiting of the present invention, excepting as it is set forth and defined in the hereto-appendant claims.

I claim as my invention:

1. A method of floating melt zone refining of a semiconductor crystal rod comprising:

arranging a semiconductor crystal rod within a floating zone melt environment with a seed crystal attached to a lower end thereof;

generating a melt zone at the juncture of said seed crystal and said rod and controllably moving said melt zone away from said juncture through said rod to a select point on such rod;

uniformly supporting said lower end of said rod so as to prevent oscillations at the juncture of said crystal and said rod by axially upwardly moving a conductive hollow funnel-shaped jacket from a position below said juncture to a position surrounding said lower end of the rod, said jacket including a conductive stabilizing means therein;

establishing operational contact between an electrical current source, said jacket and an upper end of said rod;

feeding an electrical current through said jacket and stabilizing means through the rod so that said electrical current passes from said jacket across said melt zone; and controllably moving said melt zone from said select point on the rod through the remaining portions of said rod.

2. A process as defined in claim 1 wherein said feeding of electrical current through the rod and across the melt zone occurs in a continuous manner.

3. A process as defined in claim 1 wherein said feeding of electrical current through the rod and across the melt zone occurs in a discontinuous manner.

4. A process as defined in claim 9 wherein said funnel-shaped jacket is composed of a material selected from the group consisting of titanium and steel and said stabilizing means is composed of a material selected from the group consisting of steel spheroids, steel granules, silicon granules and a liquefied metal.

5. A device for floating zone melt processing of a semiconductor rod comprising:

an operative floating zone melt apparatus including two vertically opposing approximately coaxially mounted members for supporting a semiconductor rod within said apparatus;

a conductive funnel-shaped jacket means coupled to a lower one of said mounting members in an axially movable relation to said one mounting member, said jacket means being movable to an uppermost position for encompassing a cone area of the rod supported between said mounting members, said jacket being filled with a conductive stabilizing means; and electrical conduit means operationally connecting said jacket means to a voltage source and to an upper one of said mounting members.

6. A device as defined in claim 5 wherein said upper mounting member includes a conductive socket composed of a material selected from the group consisting of molybdenum, tantalum, titanium and stainless steel in direct contact with an upper end of said semiconductor rod, said socket being encompassed with an aluminum oxide ring which is supported on said upper support member.

7. An apparatus as defined in claim 5 wherein the funnel-shaped jacket includes a means attached laterally thereto for introducing the stabilizing means into the jacket when said jacket is moved to said uppermost position.

* * * * *